(12) United States Patent
Zhang et al.

(10) Patent No.: US 9,524,686 B2
(45) Date of Patent: Dec. 20, 2016

(54) SHIFT REGISTER UNIT, GATE ELECTRODE DRIVE CIRCUIT AND DISPLAY APPARATUS

(71) Applicant: BOE Technology Group Co., Ltd., Beijing (CN)

(72) Inventors: Yuanbo Zhang, Beijing (CN); Jiayang Zhao, Beijing (CN); Seung Woo Han, Beijing (CN); Xing Yao, Beijing (CN); Haifeng Jin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 123 days.

(21) Appl. No.: 14/436,932

(22) PCT Filed: Jul. 30, 2014

(86) PCT No.: PCT/CN2014/083290
§ 371 (c)(1),
(2) Date: Apr. 20, 2015

(87) PCT Pub. No.: WO2015/143811
PCT Pub. Date: Oct. 1, 2015

(65) Prior Publication Data
US 2016/0049126 A1    Feb. 18, 2016

(30) Foreign Application Priority Data

Mar. 27, 2014 (CN) .......................... 2014 1 0119039

(51) Int. Cl.
*G09G 3/36* (2006.01)
*G11C 19/00* (2006.01)
(Continued)

(52) U.S. Cl.
CPC .......... *G09G 3/3648* (2013.01); *G06F 3/0416* (2013.01); *G09G 3/36* (2013.01);
(Continued)

(58) Field of Classification Search
CPC ................ G09G 3/3648; G09G 3/3696; G09G 2310/0286; G09G 2310/08; G09G 2300/0426; G09G 3/36488; G06F 3/0416; G11C 19/02
See application file for complete search history.

(56) References Cited

U.S. PATENT DOCUMENTS

| 6,345,085 | B1* | 2/2002 | Yeo | ......................... G11C 19/00 377/54 |
|---|---|---|---|---|
| 2006/0269038 | A1* | 11/2006 | Jang | ..................... G11C 19/287 377/64 |
| 2013/0241814 | A1* | 9/2013 | Hirabayashi | ......... G09G 3/3677 345/100 |

FOREIGN PATENT DOCUMENTS

| CN | 102629444 A | 8/2012 |
|---|---|---|
| CN | 102867477 A | 1/2013 |

(Continued)

OTHER PUBLICATIONS

International Search Report and Written Opinion for PCT Application No. PCT/CN2014/083290, dated Nov. 26, 2014, 10 pages.

*Primary Examiner* — Joseph Haley
*Assistant Examiner* — Ifedayo Iluyomade
(74) *Attorney, Agent, or Firm* — Westman, Champlin & Koehler, P.A.

(57) ABSTRACT

The present disclosure provides a shift register unit, a gate electrode drive circuit and a display apparatus, which relates to a technical field of display. The shift register unit includes an input reset module, a pull up module, a control module and a pull down module. By inputting a high level into the second signal input end of the input reset module in the touch scan to maintain the level at the pull up control node, the electrical leak effects at the pull up control node may be avoided efficiently. In this way, the defects of insufficient (Continued)

charging rate of the row pixels may be avoided and the dark lines or bad bright lines may be suppressed.

20 Claims, 4 Drawing Sheets

(51) Int. Cl.
*G06F 3/041* (2006.01)
*G11C 19/28* (2006.01)

(52) U.S. Cl.
CPC ......... *G09G 3/3674* (2013.01); *G09G 3/3696* (2013.01); *G11C 19/00* (2013.01); *G11C 19/28* (2013.01); *G09G 2300/0426* (2013.01); *G09G 2310/0286* (2013.01); *G09G 2310/08* (2013.01)

(56) References Cited

FOREIGN PATENT DOCUMENTS

| | | |
|---|---|---|
| CN | 103943055 A | 7/2014 |
| CN | 203760057 U | 8/2014 |

\* cited by examiner

SHIFT REGISTER UNIT, GATE ELECTRODE DRIVE CIRCUIT AND DISPLAY APPARATUS

CROSS-REFERENCE TO RELATED APPLICATION

This Application is a Section 371 National Stage Application of International Application No. PCT/CN2014/083290, filed Jul. 30, 2014, which has not yet published, which claims priority to Chinese Patent Application No. 201410119039.5, filed Mar. 27, 2014, in Chinese, the contents of which are hereby incorporated by reference in their entirety.

BACKGROUND OF THE INVENTION

Field of the Invention

The present disclosure relates to the technical field of display, more particularly, relates to a shift register unit, a gate electrode drive circuit and a display apparatus.

Description of the Related Art

As a touch-sensitive display apparatus develops, the requirement for quality of it becomes more and more. In-cell touch technology is applied widely due to its advantages such as low thickness and high touch sensitivity.

An in-cell touch element is integrated into a display panel to impart the touch-sensitive function to the panel itself such that the touch-sensitive effects and applications can be achieved without being adhered and assembled to the touch-sensitive panel otherwise. A typical TFT-LCD (Thin Film Transistor-Liquid Crystal Display) may be taken as an example, which has the following advantages: the touch-sensitive element may be produced finally in a TFT-LCD standard process; as the touch-sensitive panel does not need to be arranged additionally, the problem of adhering and alignment is avoided, the weight and thickness are reduced significantly, and the product becomes lighter. Use of the embedding technology may eliminate the frame of the display apparatus product, so as to achieve full plane design, and thus the product design may become concise and the application field becomes wider.

The conventional in-cell touch technology typically uses projection multiple point capacitance touch. Collection of its touch sensitive signals is achieved by signal lines located in two layers. The signal lines in one layer are drive lines (Tx lines) and the signal lines in the other layer are sensitive lines (Rx lines). The wiring direction in any one of the two layers is perpendicular to that in the other layer. In practice, all of drive lines are driven alternatively by means of scans and it measures whether there is a capacitance couple effect in a certain point on the sensitive lines crossed with the respective drive lines. By scanning one by one, an exact touch point position may be obtained and multiple point touch may be achieved.

For the conventional touch-sensitive display apparatus, the pixels and scan lines on the same column or row will be interfered with each other when they are charged simultaneously. Thus, the processes of the pixel charging and of the scan are typically performed separately in time, in particular, generally in two timing modes of V-Blank and H-Blank in one frame. V-Blank mode means within one frame a period is left for touch-sensitive signal scan after all of pixels have been charged, that is, the pixel charging operation and the touch-sensitive scan are performed separately. This mode can only support the same refresh rate of touch scan as the refresh rate of the display screen (in a ratio of 1:1). If the refresh rate of the display screen is 60 Hz, that of the touch scan can only be 60 Hz. In order to improve the touch sensitivity, it is crucial to enhance the frequency of touch scan. A touch refresh rate of 120 Hz or more is necessary if it is desired to achieve the touch experiences of high performance.

H-Blank mode may improve the refresh rate for touch scan efficiently. This mode remains a period for performing a part of touch signal scan in a charging interval of a certain rows of pixels in one frame, that is, the pixel charging operation and the touch scan are performed alternatively. This mode can support a touch scan refresh rate greater than the display screen refresh rate, that is, it may be multiple of the display screen refresh rate. The in-cell touch scan timing for achieving double of display refresh rate by H-Blank mode may be illustrated in FIG. 1. By dividing the display scan operation into two sections equally, after each of the sections ends up, the pixel scan GOA (Gate Drive on Array) circuit is stopped temporarily working, one scan (Tx scan) is performed for all of touch-sensitive lines. Thus, in one display scan, two touch scans may be done to achieve a touch scan having the refresh rate double of the display screen refresh rate.

The conventional GOA circuit typically includes a plurality of cascaded shift register units. They may have structures as illustrated in FIG. 2. These shift register units are connected to those in adjacent line respectively one by one. Each of the shift register units corresponds to one row of gate lines. Each row of shift register units may pre-charge the next row of the shift register units while each row of shift register units outputs the gate drive signals, in order to ensure the next row of shift register units to achieve the output in the next clock period. In the prior art, as illustrated in FIG. 3, 4T1C is taken as an example of the shift register unit having the simplest structure. When the H-Blank timing scan is performed as illustrated in FIG. 1, as the (N/2+1)th row of shift register units is the earliest row for the second ½ display scan, but its pull up control node PU has been charged into a high level when outputs are done at the (N/2)th. As there is a rather long scan period between the (N/2)th row output and the (N/2+1)th row output, the potential at the node PU may be leaked by the connected TFT so as to seriously degrade the pre-charging of the (N/2+1)th row of shift register units and thus the voltage will be reduced when the (N/2+1)th row of shift register units output. In this way, the row of pixels have insufficient charging rate and thus dark lines or bad bright lines may occur.

SUMMARY OF THE INVENTION

An embodiment of the present invention provides a shift register unit, a gate electrode drive circuit and a display apparatus, which may avoid insufficient charging rate of the row pixels and may suppress dark lines or bad bright lines.

In order to achieve the above objects, the embodiments of the present invention may be implemented as follows.

In an aspect, an embodiment of the present invention provides a shift register unit, comprising:

an input reset module which has a first signal input end, a second signal input end, a first voltage connecting end, a second voltage connecting end and a first pull up control node connecting end, and is configured to control a level at the pull up control node depending on a signal inputted from the first signal input end and the second signal input end;

a pull up module which has a first clock signal input end, a second pull up control node connecting end and a pull up module signal output end and is configured to selectively pull up the signal outputted from the pull up module signal output end to a high level depending on the level at the pull up control node and the clock signal inputted from the first clock signal input end;

a control module which has a second clock signal input end, a first connecting end for a third voltage, a third pull up control node connecting end and a first pull down control node connecting end and is configured to control a level at the pull down control node depending on the clock signal inputted from the second clock signal input end and the level at the pull up control node; and a pull down module which has a fourth pull up control node connecting end, a second pull down control node connecting end, a second connecting end for the third voltage, a fourth voltage connecting end and a pull down module signal output end and is configured to selectively pull down the signal outputted from the pull down module signal output end to a low level, wherein the first voltage connecting end is connected to a first voltage input end of the shift register unit, the second voltage connecting end is connected to a second voltage input end of the shift register unit, the first connecting end for the third voltage and the second connecting end for the third voltage are both connected to the third voltage input end of the shift register unit, the fourth voltage connecting end is connected to a fourth voltage input end of the shift register unit, the pull up module signal output end and the pull down module signal output end are connected to form a signal output end of the shift register unit, the pull up control node being a connecting point connected with the first pull up control node connecting end, the second pull up control node connecting end, the third pull up control node connecting end and the fourth pull up control node connecting end, the pull down control node being a connecting point connected with the first pull down control node connecting end and the second pull down control node connecting end, wherein the high level is inputted into the second signal input end in a touch scan to maintain the level at the pull up control node.

In a further embodiment of the above shift register unit, the input reset module comprises:

a first transistor which has a first electrode connected to the first pull up control node connecting end, a gate electrode connected to the first signal input end and a second electrode connected to the first voltage connecting end, the first electrode of the first transistor being one of a source electrode and a drain electrode of the first transistor, the second electrode of the first transistor being the other of the source electrode and the drain electrode of the first transistor; and a second transistor which has a first electrode connected to the second voltage connecting end, a gate electrode connected to the second signal input end and a second electrode connected to the first pull up control node connecting end, the first electrode of the second transistor being one of a source electrode and a drain electrode of the second transistor, the second electrode of the second transistor being the other of the source electrode and the drain electrode of the second transistor.

In an embodiment of the above shift register unit, the signal inputted from the first voltage connecting end is a signal inputted from the first signal input end.

In an embodiment of the above shift register unit, the pull up module comprises:

a third transistor which has a first electrode connected to the pull up module signal output end, a gate electrode connected to the second pull up control node connecting end and a second electrode connected to the first clock signal input end, the first electrode of the third transistor being one of a source electrode and a drain electrode of the third transistor, the second electrode of the third transistor being the other of the source electrode and the drain electrode of the third transistor; and a capacitance connected between the gate electrode of the third transistor and the first electrode of the third transistor.

In an embodiment of the above shift register unit, the control module may comprise:

a fourth transistor which has a gate electrode and a second electrode both connected to the second clock signal input end;

a fifth transistor which has a gate electrode connected to a first electrode of the fourth transistor and a second electrode connected to the second clock signal input end;

a sixth transistor which has a first electrode connected to the first connecting end for the third voltage, a gate electrode connected to the third pull up control node connecting end and a second electrode connected to the first electrode of the fourth transistor;

a seventh transistor which has a first electrode connected to the first connecting end for the third voltage, a gate electrode connected to the third pull up control node connecting end and a second electrode connected to the first pull down control node connecting end, wherein the first electrode of any one transistor of the fourth to seventh transistors being one of a source electrode and a drain electrode of the one transistor, the second electrode of any one transistor of the fourth to seventh transistors being the other of the source electrode and the drain electrode of the one transistor.

In a further embodiment of the above shift register unit, the pull down module may comprise:

an eighth transistor which has a first electrode connected to the fourth voltage connecting end, a gate electrode connected to the second pull down control node connecting end and a second electrode connected to the fourth pull up control node connecting end, wherein an input voltage at the fourth voltage connecting end is the same as that at the second voltage connecting end;

a ninth transistor which has a first electrode connected to the second connecting end for the third voltage, a gate electrode connected to the second pull down control node connecting end and a second electrode connected to the pull down module signal output end, wherein the first electrode of any one transistor of the eighth to ninth transistors being one of a source electrode and a drain electrode of the one transistor, the second electrode of any one transistor of the eighth to ninth transistors being the other of the source electrode and the drain electrode of the one transistor.

In an embodiment of the above shift register unit, the pull down module may comprise:

an eighth transistor which has a first electrode connected to the fourth voltage connecting end, a gate electrode connected to the second pull down control node connecting end and a second electrode connected to the fourth pull up control node connecting end; and a ninth transistor which has a first electrode connected to the second connecting end for the third voltage, a gate electrode connected to the second pull down control node connecting end and a second electrode connected to the pull down module signal output end.

In another aspect, an embodiment of the present invention provides a gate electrode drive circuit comprising a plurality of shift register units, as described in any of the above embodiments, cascaded to each other, wherein touch scan and scan output for the plurality of cascaded shift register units are performed alternatively;

other than the first cascade shift register unit, the signal output end of each shift register unit is connected to the second signal input end of the adjacent previous cascade shift register unit; and other than the last cascade shift register unit, the signal output end of each shift register unit is connected to the first signal input end of the adjacent next cascade shift register unit.

In the above gate electrode drive circuit, a frame initialization signal may be inputted into the first signal input end of the first cascade shift register unit and a reset signal is inputted into the second signal input end of the last cascade shift register unit, or a frame initialization signal is inputted into the second signal input end of the last cascade shift register unit and a reset signal is inputted into the first signal input end of the first cascade shift register unit.

In addition, an embodiment of the present invention also provides a display apparatus comprising the gate electrode drive circuit as described in any of the above embodiments.

The shift register unit, the gate electrode drive circuit and the display apparatus provided by the embodiments of the present invention include an input reset module, a pull up module, a control module and a pull down module. By inputting a high level into the second signal input end of the input reset module in the touch scan to maintain the level at the pull up control node, the electrical leak effects at the pull up control node may be avoided efficiently. In this way, the electrical leak effects at node PU in the first cascade shift register unit may be avoided after the touch scan, the electrical leak being caused by a relatively long touch scan period between outputs of two rows of shift register units. Thereby, the defects of insufficient charging rate of the row pixels may be avoided while remaining a high report rate of the touch scan, so as to improve the dark lines or bad bright lines significantly and to improve the display quality.

DETAILED DESCRIPTION OF EMBODIMENTS OF THE INVENTION

Figure 1:
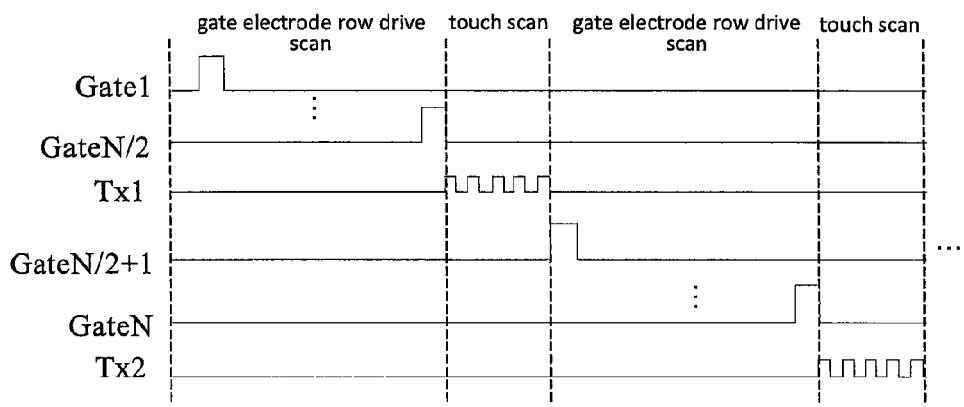
FIG. 1 shows schematically a timing diagram of an in-cell touch scan with a refresh rate double of the display screen refresh rate by means of H-Blank mode in the prior art.
Figure 2:
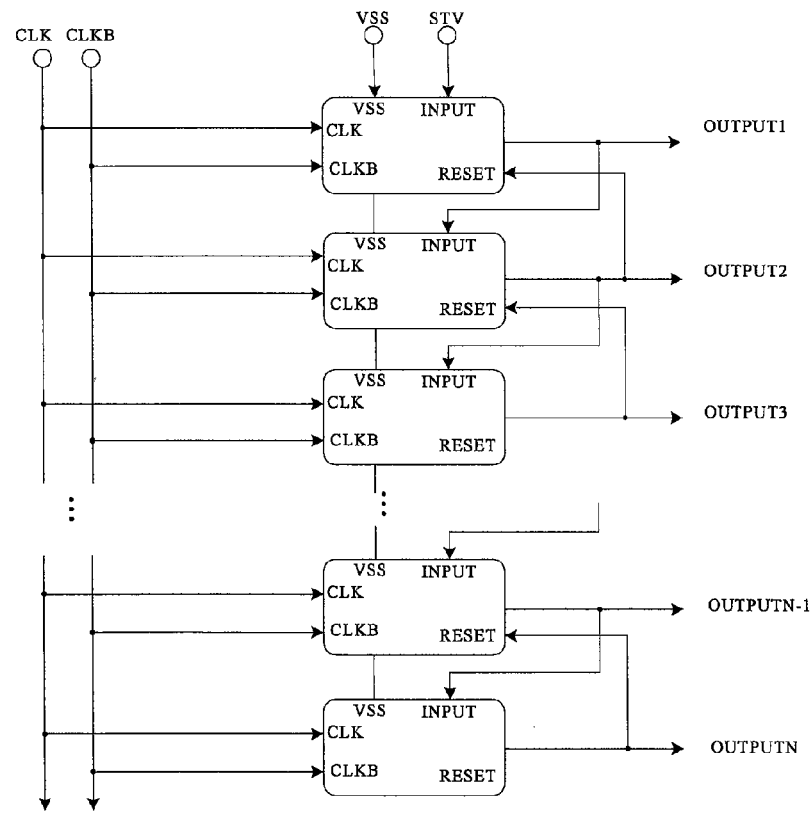
FIG. 2 shows schematically an arrangement of a gate electrode drive circuit in the prior art.
Figure 3:
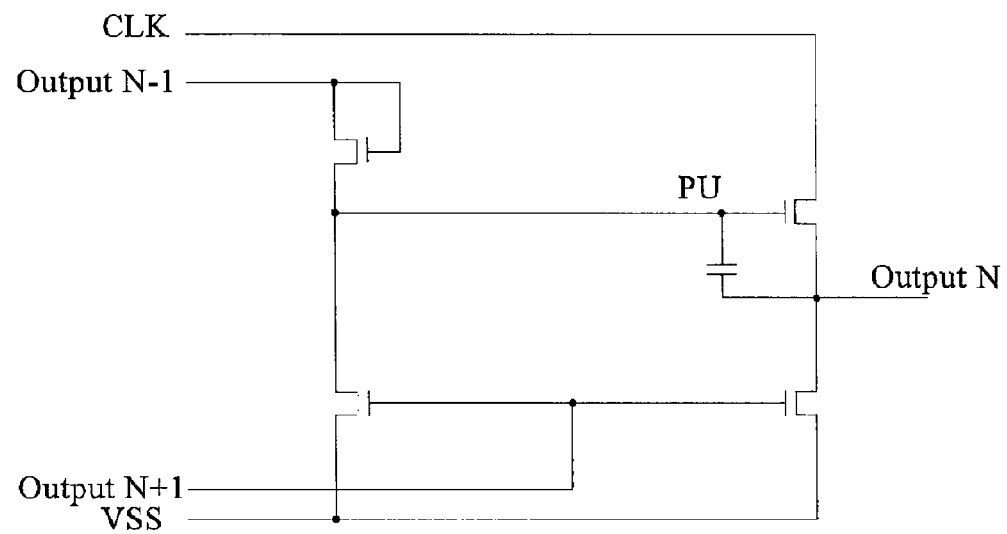
FIG. 3 shows schematically an arrangement of a shift register unit in a gate electrode drive circuit in the prior art.

Exemplary embodiments of the present disclosure will be described clearly and entirely hereinafter with reference to the attached drawings. Apparently, the disclosed embodiments are only part of those of the present invention, instead of all of embodiments. In view of these embodiments of the present invention, the skilled person in the art may envisage other embodiments. All of the other embodiments also fall within scope of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

All of transistors used in all of embodiments of the present invention may be thin film transistors or field effect transistors or other devices with the same properties. As the source electrode and the drain electrode of the transistor are symmetrical with respect to each other herein, the source electrode and the drain electrode will not be distinguishable. In embodiments of the present invention, in order to represent the two electrodes of the transistor other than the gate electrode, one of them is defined as a first electrode while the other is defined as a second electrode. Furthermore, the transistors may be classified into N type transistors and P type transistors depending on characteristics of them. In the following embodiments, N type transistors are taken as an example. When an N type transistor is used, the first electrode may be the source electrode of the N type transistor and the second electrode may be the drain electrode of the N type transistor. The skilled person in the art will appreciate that the present invention is not limited to this, for example, a P type transistor may also be used in embodiments of the present invention.

In accordance with the generic concept of the present invention, it provides a shift register unit comprising:

an input reset module which has a first signal input end, a second signal input end, a first voltage connecting end, a second voltage connecting end and a first pull up control node connecting end, and is configured to control the level at the pull up control node depending on a signal inputted from the first signal input end and the second signal input end;

a pull up module which has a first clock signal input end, a second pull up control node connecting end and a pull up module signal output end and is configured to selectively pull up the signal outputted from the pull up module signal output end to a high level depending on the level at the pull up control node and the clock signal inputted from the first clock signal input end;

a control module which has a second clock signal input end, a first connecting end for a third voltage, a third pull up control node connecting end and a first pull down control node connecting end and is configured to control a level at the pull down control node depending on the clock signal inputted from the second clock signal input end and the level at the pull up control node; and a pull down module which has a fourth pull up control node connecting end, a second pull down control node connecting end, a second connecting end for the third voltage, a fourth voltage connecting end and a pull down module signal output end and is configured to selectively pull down the signal outputted from the pull down module signal output end to a low level, wherein the first voltage connecting end is connected to a first voltage input end of the shift register unit, the second voltage connecting end is connected to a second voltage input end of the shift register unit, the first connecting end for the third voltage and the second connecting end for the third voltage are both connected to the third voltage input end of the shift register unit, the fourth voltage connecting end is connected to a fourth voltage input end of the shift register unit, the pull up module signal output end and the pull down module signal output end are connected to form a signal output end of the shift register unit, the pull up control node being a connecting point connected with the first pull up control node connecting end, the second pull up control node connecting end, the third pull up control node connecting end and the fourth pull up control node connecting end, the pull down control node being a connecting point connected with the first pull down control node connecting end and the second pull down control node connecting end, wherein the high level is inputted into the second signal input end in a touch scan to maintain the level at the pull up control node.

Figure 4:
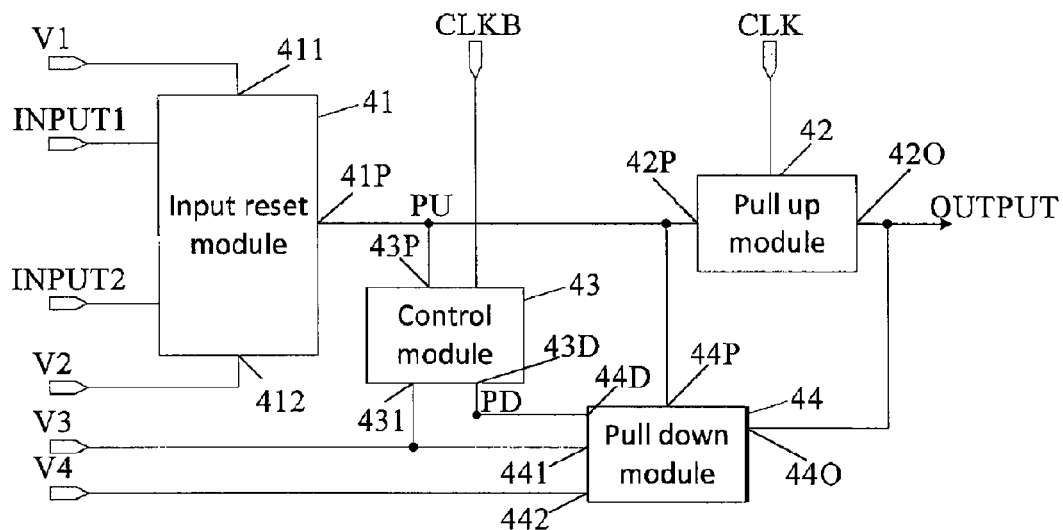
FIG. 4 shows schematically an arrangement of a shift register unit according to an embodiment of the present invention.

The shift register unit provided by an embodiment of the present invention, as illustrated in FIG. 4, includes: an input reset module 41, a pull up module 42, a control module 43 and a pull down module 44.

In an embodiment, the input reset module 41 has a first signal input end INPUT1, a second signal input end INPUT2, a first voltage connecting end 411, a second voltage connecting end 412 and a first pull up control node connecting end 41P. The input reset module 41 is configured to control the level at the pull up control node PU depending on a signal inputted from the first signal input end INPUT1 and the second signal input end INPUT2. As an example, if a high level is inputted into the second signal input end INPUT2, the first pull up control node connecting end 41P outputs the high level. For example, the high level is inputted into the second signal input end INPUT2 in touch scan. It may maintain the level at the pull up control node PU connected with the first pull up control node connecting end 41P. In an example, the first voltage connecting end 411 and the second voltage connecting end 412 are connected with the first voltage input end V1 and the second voltage input end V2 of the shift register unit, respectively.

The pull up module 42 has a first clock signal input end CLK, a second pull up control node connecting end 42P and a pull up module signal output end 42O. The pull up module 42 is configured to selectively pull up the signal outputted from the pull up module signal output end 42O to the high level depending on the level at the pull up control node PU connected to the second pull up control node connecting end 42P and a clock signal inputted from the first clock signal input end CLK. As an example, when a trigger is produced by the clock signal inputted from the first clock signal input end CLK (for example, by a leading edge or a trailing edge of the clock signal), if the level at the pull up control node PU is the high level, the signal outputted from the pull up module signal output end 42O will be pulled up to the high level and maintained until the level at the pull up control node PU decreases. However, the embodiments of the present invention are not limited to this, for example, in another example, the signal outputted from the pull up module signal output end 42O may alternatively be pulled up to the high level in case that the level at the pull up control node PU is a low level.

The control module 43 has a second clock signal input end CLKB, a first connecting end 431 for a third voltage, a third pull up control node connecting end 43P and a first pull down control node connecting end 43D. The control module 43 is configured to control a level at the pull down control node PD connected with the first pull down control node connecting end 43D depending on the clock signal inputted from the second clock signal input end CLKB and the level at the pull up control node PU connected with the third pull up control node connecting end 43P.

The pull down module 44 has a fourth pull up control node connecting end 44P, a second pull down control node connecting end 44D, a second connecting end 441 for the third voltage, a fourth voltage connecting end 442 and a pull down module signal output end 44O. The pull down module 44 is configured to selectively pull down the signal outputted from the pull down module signal output end 44O to a low level. As an example, the pull down module 44 may be configured that the signal outputted from the pull down module signal output end 44O will be pulled down to the low level if the level at the pull down control node PD is a high level. However, the embodiments of the present invention are not limited to this, for example, in another example, the signal outputted from the pull down module signal output end 44O may alternatively be pulled down to the low level in case that the level at the pull down control node PD is the low level.

In the above example, the first connecting end 431 for a third voltage and the second connecting end 441 for the third voltage are both connected with a third voltage input end V3 of the shift register unit, the fourth voltage connecting end 442 is connected to a fourth voltage input end V4 of the shift register unit. The pull up module signal output end 42O and the pull down module signal output end 44O are connected to form a signal output end OUTPUT of the shift register unit. The pull up control node PU is a connecting point connected with the first pull up control node connecting end 41P, the second pull up control node connecting end 43P, the third pull up control node connecting end 42P and the fourth pull up control node connecting end 44P. The pull down control node PD is a connecting point connected with the first pull down control node connecting end 43D and the second pull down control node connecting end 44D.

As an example, the low level VSS signal may be inputted into the third voltage input end V3 of the shift register unit. The clock signals inputted from the first clock signal input end CLK and the second clock signal input end CLKB are both square wave clock signals and have the same period and duty cycle, but opposite phases, that is, the low level will be inputted into the second clock signal input end CLKB if the high level is inputted into the first clock signal input end CLK.

The shift register unit provided by the embodiments of the present invention includes an input reset module 41, a pull up module 42, a control module 43 and a pull down module 44. By inputting a high level into the second signal input end INPUT2 of the input reset module 41 in the touch scan to maintain the level at the pull up control node, the electrical leak effects at the pull up control node may be suppressed efficiently. In this way, the electrical leak effects at node PU in the first cascade shift register unit may be avoided after the touch scan, since the electrical leak is caused by a relatively long touch scan time between outputs of two rows of shift register units. Thereby, the defects of insufficient charging rate of the row pixels may be avoided while keeping a high report rate of the touch scan, so as to improve the dark lines or bad bright lines significantly and to improve the display quality.

Figure 5:
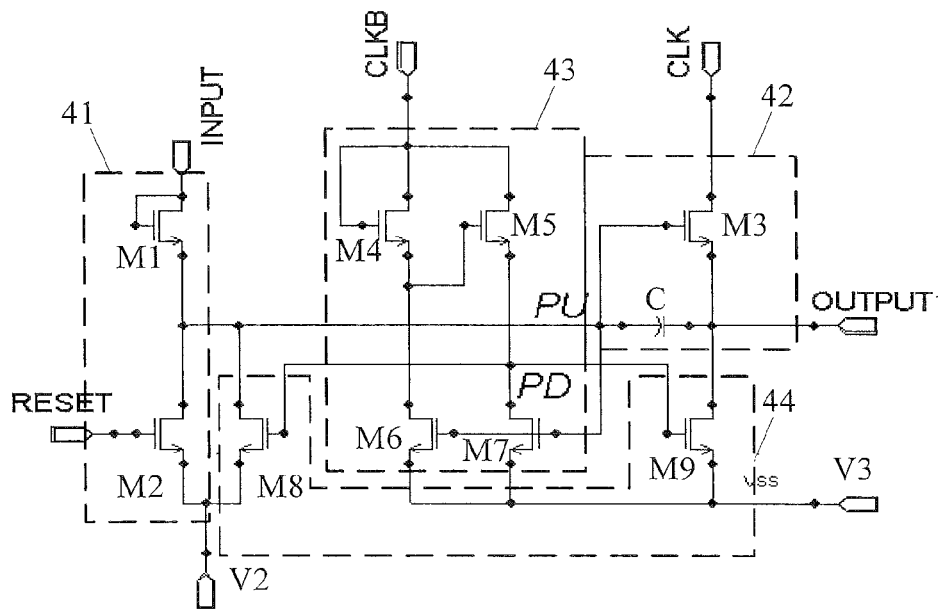
FIG. 5 shows schematically a circuit connecting arrangement in a shift register unit according to an embodiment of the present invention.

As an example, the shift register unit provided by the embodiment of the present invention may be the specific structures as illustrated in FIG. 5. In an example, the input reset module 41 may include:

a first transistor M1 which has a first electrode connected to the first pull up control node connecting end 41P (pull up control node PU), a gate electrode connected to the first signal input end INPUT1 and a second electrode connected to the first voltage connecting end 411; and a second transistor M2 which has a first electrode connected to the second voltage connecting end 412, a gate electrode connected to the second signal input end INPUT2 and a second electrode connected to the first pull up control node connecting end 41P (pull up control node PU).

In embodiments of the present invention, the pull up control node PU means a circuit node which is used to control ON or OFF state of the pull up module 42. The input reset module 41 has the function that the high or low level at the pull up control node PU may be determined depending on whether the level at the first signal input end INPUT1 is the low level or the high level and whether the level at the second signal input end INPUT2 is the low level or the high level, thereby, it may determine whether the shift register unit is currently in an output state or a reset state.

In such an arrangement, the input reset module 41 may achieve a gate electrode row drive single direction scan from up to down. In particular, when the output end OUTPUT of the previous cascade shift register unit outputs a signal, the outputting signal is inputted into the input end INPUT1 of the current cascade shift register so as to achieve the pre-charging for the current cascade PU node and the output end OUTPUT of the current cascade shift register unit does not output a signal until the next clock period comes up. The output signal of the current cascade shift register unit is also inputted simultaneously into both the input end INPUT2 of the previous cascade shift register unit and the input end INPUT1 of the next cascade shift register unit such that the reset of the previous cascade shift register unit and the pre-charging to the PU node of the next cascade shift register unit may be achieved; and so on. Finally, the single direction cascaded scan from up to down may be achieved. The shift register unit shown in FIG. 5 is explained by taking such input reset module 41 having single direction scan function as an example.

Or, when the signals outputted from the cascaded shift register units are used as the input signal at the first signal input end INPUT1 or the second signal input end INPUT2 of the current cascade shift register unit, the input reset module 41 of such arrangement may also achieve dual direction scan of the gate electrode drive circuit. In particular, the first signal input end INPUT1 may be connected with the output end OUTPUT of the previous cascade shift register unit and the second signal input end INPUT2 may be connected with the output end OUTPUT of the next cascade shift register unit.

When the high level is inputted into the first voltage input end V1 and the low level is inputted into the second voltage input end V2, the high level outputted from the previous cascade shift register unit may pre-charge the pull up module 42 by the input reset module 41 and the high level outputted from the next cascade shift register unit may reset the pull up module 42 by the input reset module 41.

When the low level is inputted into the first voltage input end V1 and the high level is inputted into the second voltage input end V2, the high level outputted from the next cascade shift register unit may pre-charge the pull up module 42 by the input reset module 41 and the high level outputted from the previous cascade shift register unit may reset the pull up module 42 by the input reset module 41.

It should be noted that, in the shift register unit as shown in FIG. 5, the signal inputted from the first voltage input end V1 is the signal inputted from the first signal input end INPUT1. In particular, during the single direction scan, by connecting the output signal of the previous cascade shift register unit with both the gate electrode and the second electrode of the first transistor M1, the high level can be inputted while the first transistor M1 is switched on.

As an example, as illustrated in FIG. 5, the pull up module 42 may include:

a third transistor M3 which has a first electrode connected to the pull up module signal output end 42O (the signal output end OUTPUT of the shift register unit), a gate electrode connected to the second pull up control node connecting end 42P (the pull up control node PU) and a second electrode connected to the first clock signal input end CLK; and a capacitance C connected between the gate electrode of the third transistor M3 and the first electrode of the third transistor M3.

In embodiments of the present invention, the pull up module 42 functions to enable the signal output end OUTPUT to output the high level signal for driving the gate electrode after the pre-charging is performed and within the clock period in which the clock signal inputted from the first clock signal input end CLK is the high level.

As an example, as shown in FIG. 5, the control module 43 may include:

a fourth transistor M4 which has a gate electrode and a second electrode both connected to the second clock signal input end CLKB;

a fifth transistor M5 which has a gate electrode connected to a first electrode of the fourth transistor M4 and a second electrode connected to the second clock signal input end CLKB;

a sixth transistor M6 which has a first electrode connected to the first connecting end 431 for the third voltage (the third voltage input end V3), a gate electrode connected to the third pull up control node connecting end 43P (the pull up control node PU) and a second electrode connected to the first electrode of the fourth transistor M4; and a seventh transistor M7 which has a first electrode connected to the first connecting end 431 for the third voltage (the third voltage input end V3), a gate electrode connected to the third pull up control node connecting end 43P (the pull up control node PU) and a second electrode connected to the first pull down control node connecting end 43D (the pull down control node PD).

In the embodiment of the present invention, the control module 43 functions to control the level at the pull down control node PD depending on the voltage at the pull up control node PU. The pull down control node PD is a circuit node which is used to control the ON or OFF state of the pull down module 44.

As an example, in the shift register unit as shown in FIG. 5, when the signal inputted from the first voltage input end V1 is the signal inputted from the first signal input end INPUT1, the pull down module 44 may include:

an eighth transistor M8 which has a first electrode connected to the fourth voltage connecting end 442 (the fourth voltage input end V4), a gate electrode connected to the second pull down control node connecting end 44D (the pull down control node PD) and a second electrode connected to the fourth pull up control node connecting end 44P (the pull up control node PU), wherein an input voltage at the fourth voltage input end V4 is the same as that at the second voltage input end V2;

a ninth transistor M9 which has a first electrode connected to the second connecting end 441 for the third voltage (the third voltage input end V3), a gate electrode connected to the second pull down control node connecting end 44D (the pull down control node PD) and a second electrode connected to the pull down module signal output end 44O (the signal output end OUTPUT of the shift register unit).

By means of such pull down module 44, the circuit can be further simplified while it achieves the single direction scan of the shift register unit to facilitate design and manufacturing.

In the conventional single direction scan shift register unit, the charges at the node PU are mainly leaked to the second voltage end V2 having the low level by the transistors M2 and M8 (at this time, it is the case of forward scan, in contrast, in the reverse scan the leakage is performed by the transistors M1 and M8, in the following paragraphs, the forward scan will be taken as the example), and thus, there is the electrical leak effect in the above transistors when the touch scan is performed. As shown in FIG. 5, in single direction scan shift register unit provided by the embodiments of the present invention, the transistors M2 and M8 are both connected to the second voltage end V2. In the touch scan, the input signal BW of the second voltage end V2 is set as the high level so that Vbw>Vpu, where Vbw is the level of the input signal BW of the second voltage end V2, Vpu is the level at the pull up control node PU. On the basis of the characteristics of the transistors, at that time, the electrical leak of the node PU by the transistors M2 and M8 will be converted into charging of the input signal BW to the node PU by the transistors M2 and M8. In this way, the electrical leak of the transistors M2 and M8 may be reduced significantly so as to suppress the electrical leak at the node PU of the single direction scan shift register unit.

Figure 6:
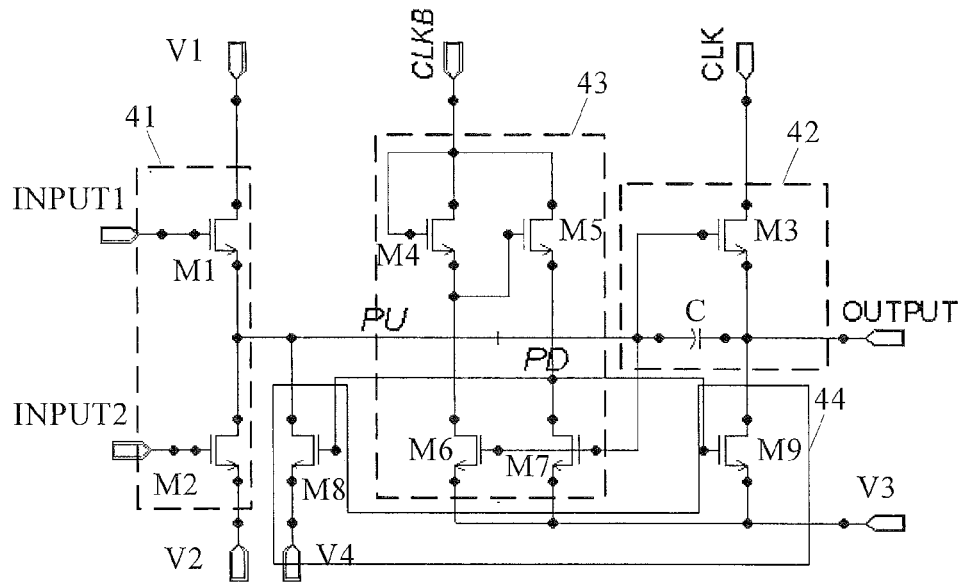
FIG. 6 shows schematically a circuit connecting arrangement in another shift register unit according to an embodiment of the present invention.

Or, in order to achieve the dual direction scan function, the shift register unit provided by an embodiment of the present invention may have the structure as shown in FIG. 6. It is distinguished from the above structure of the shift register unit in that the pull down module 44 may include:

an eighth transistor M8 which has a first electrode connected to the fourth voltage connecting end 442 (the fourth voltage input end V4), a gate electrode connected to the second pull down control node connecting end 44D (the pull down control node PD) and a second electrode connected to the fourth pull up control node connecting end 44P (the pull up control node PU), wherein the low level is inputted into the fourth voltage input end V4; and a ninth transistor M9 which has a first electrode connected to the second connecting end 441 for the third voltage (the third voltage input end V3), a gate electrode connected to the second pull down control node connecting end 44D (the pull down control node PD) and a second electrode connected to the pull down module signal output end 44O (the signal output end OUTPUT of the shift register unit).

In particular, from the analysis for the prior art, in the conventional shift register, the charges at the node PU is mainly leaked to the second voltage end V2 having the low level by the transistors M2 and M8 (herein, it is the case of forward scan, in contrast, in the reverse scan the leakage is performed by the transistors M1 and M8, in the following paragraphs, the forward scan will be taken as the example). When the PU node has a high level, the level at the pull down control node PD will be very close to the low level VSS. Due to the voltage division effects of the transistor M7, the voltage Vpd at the node PD will be slightly greater than VSS. From the simulation results, if VSS is defined as −10V, the Vpd may be about −9.6V. For the transistor M8, its gate electrode voltage Vpd may be slightly greater than its source electrode voltage VSS. It may be known from the characteristics of the transistor that the transistor will be almost conducted at that time, thus, the leak current will be very large.

Thus, an additional separate fourth voltage input end V4 may be connected to the transistor M8 to input the VSS1 direct current low level signal which is set to be greater than Vpd. And in the touch scan, the input signal BW inputted into the second voltage input end V2 is set as the high level so that Vbw>Vpu. On the basis of the characteristics of the transistor, at that time, the electrical leak from the node PU by the transistor M2 will be converted into the charging of the input signal BW to the node PU by the transistor M2 and the electrical leak of the transistor M8 may be reduced significantly so as to suppress the electrical leak at the node PU of the dual direction scan shift register unit. By means of estimation, it may be known that the leak current of the shift register unit of such arrangement may be reduced as $1/38 \sim 1/71$ of the original leak current and thus it has a significantly improved effect.

The shift register unit as shown in FIG. 5 or FIG. 6 includes 9 N type transistors and one capacitance (9T1C). In comparison with the prior art, such circuit design may include less elements so as to reduce the complication of the circuit design and production significantly, to efficiently control the size of the space occupied by the circuit region and wiring and thus it may achieve a design of narrow frame of the display apparatus.

By means of such arrangement of shift register unit, the electrical leak effects at the pull up control node can be suppressed efficiently by inputting the high level into the second signal input end of the input reset module in the touch scan to maintain the level at the pull up control node.

Figure 7:
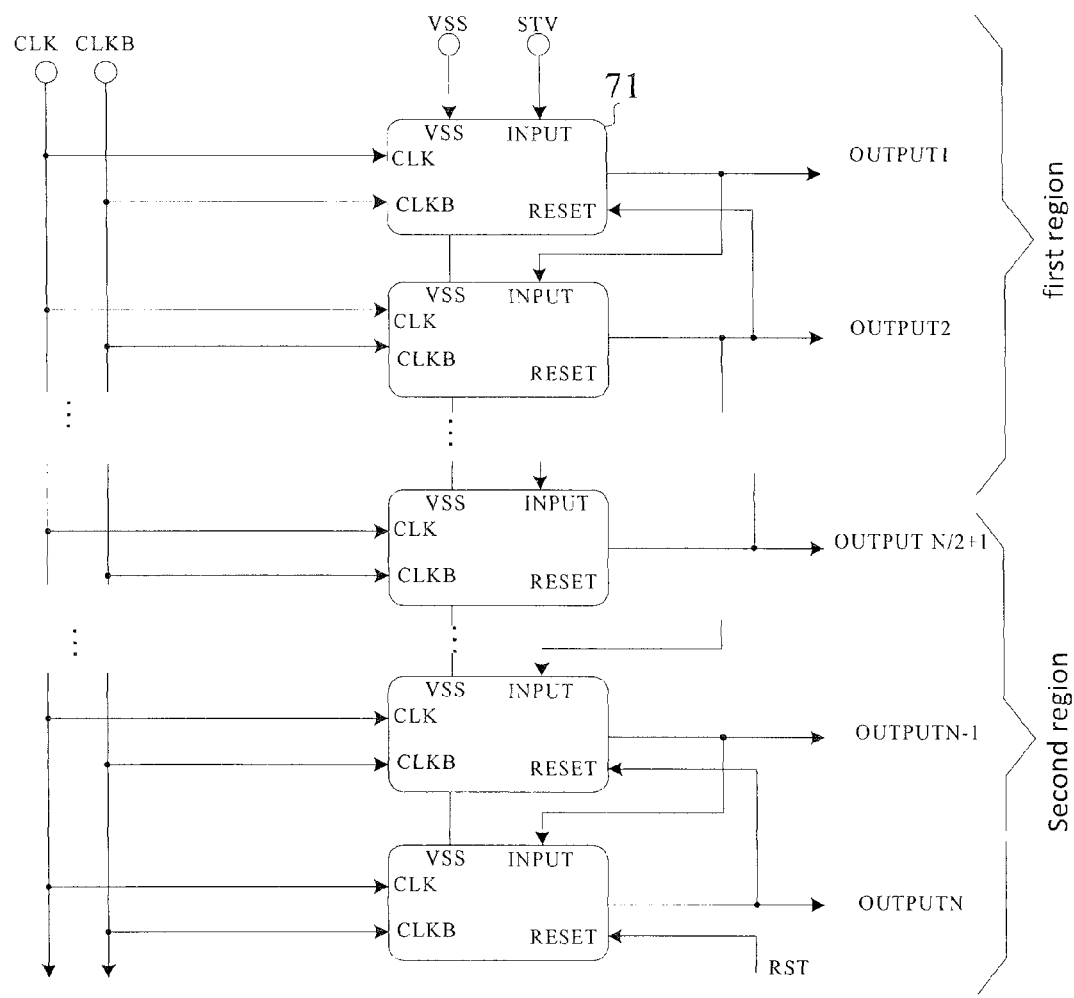
FIG. 7 shows schematically an arrangement of a gate electrode drive circuit according to an embodiment of the present invention.

An embodiment of the present invention provides a gate electrode drive circuit, as illustrated in FIG. 7, comprising a plurality of shift register units 71 cascaded to each other, in which touch scan and scan output for the plurality of cascaded shift register units 71 are performed alternatively.

In an example, other than the first cascade shift register unit, the signal output end OUTPUT of each shift register unit 71 is connected to the second signal input end INPUT2 of the adjacent previous cascade shift register unit.

Other than the last cascade shift register unit, the signal output end OUTPUT of each shift register unit 71 is connected to the first signal input end INPUT1 of the adjacent next cascade shift register unit.

The gate electrode drive circuit provided by the embodiments of the present invention includes the shift register unit. The shift register unit includes an input reset module 41, a pull up module 42, a control module 43 and a pull down module 44. By inputting a high level into the second signal input end INPUT2 of the input reset module 41 in the touch scan to maintain the level at the pull up control node, the electrical leak effects at the pull up control node may be avoided efficiently. In this way, the electrical leak effects at node PU in the first cascade shift register unit may be avoided after the touch scan, wherein the electrical leak is caused by a relatively long touch scan period between outputs of two rows of shift register units. Thereby, the defects of insufficient charging rate of the row pixels may be avoided while remaining a high report rate of the touch scan, so as to improve the dark lines or bad bright lines significantly and to improve the display quality.

It should be noted that, during performing the gate electrode row drive scan and the touch scan for an array substrate with N rows of gate lines, in order to improve the accuracy and report rate of the touch scan, it is crucial to enhance the frequency of touch scan. Thus, multiple touch scans are desired in one gate electrode row drive scan. It may be achieved by remaining a period in advance for performing part of touch signal scan in an interval of a certain rows of pixels charging, that is, the pixel charging operation and the touch scan are performed alternatively. This mode can support a touch scan refresh rate greater than the display screen refresh rate, that is, it may be multiple of the display screen refresh rate.

In particular, in an example of the gate electrode drive circuit shown in FIG. 7, the array substrate is divided equally into two regions having the same rows of gate lines. As an example, the region in which the previous N/2 rows of gate lines are located may be defined as a first region, and the region in which the later N/2 rows of gate lines are located may be defined as a second region. The period after the first region has been scanned and before the second region is scanned, is the touch scan period. After the touch scan has been completed, the last cascade shift register unit in the first region is scanned again such that the last cascade shift register unit in the first region charges the first cascade shift register unit in the second region in advance. Certainly, the above embodiments are only exemplified. In order to further improve the refresh rate of the touch scan, the gate lines on the array substrate may be divided into more regions for scan. The present invention is not limited to the above embodiments.

In the embodiments of the present invention, when the gate electrode row drive scan is performed in an order from up to down (as shown in FIG. 7), a frame initialization signal STV, as an initialization signal, may be inputted into the first signal input end INPUT1 of the first cascade shift register unit and after the scan has been completed, a reset signal RST may be inputted into the second signal input end INPUT2 of the last cascade shift register unit. In the gate electrode drive circuit shown in FIG. 7, the scan from up to down is taken as an example.

Or, when the gate electrode row drive scan is performed in an order from down to up, a frame initialization signal STV, as an initialization signal, may be inputted into the second signal input end INPUT2 of the last cascade shift register unit and after the scan has been completed, a reset signal RST is inputted into the first signal input end INPUT1 of the first cascade shift register unit. The present invention is not limited to the above embodiments.

Furthermore, an embodiment of the present invention also provides a display apparatus comprising the gate electrode drive circuit as described in any of the above embodiments.

As the arrangements of the gate electrode drive circuit has been described in detail in the above embodiments, the details thereof will be omitted herein.

The display apparatus provided by the embodiments of the present invention includes the gate electrode drive circuit. The gate electrode drive circuit has a plurality of the shift register units cascaded to each other. Each of the shift register units in turn includes an input reset module, a pull up module, a control module and a pull down module. By inputting a high level into the second signal input end of the input reset module in the touch scan to maintain the level at the pull up control node, the electrical leak effects at the pull up control node may be avoided efficiently. In this way, the electrical leak effects at node PU in the first cascade shift register unit may be avoided after the touch scan, wherein the electrical leak is caused by a relatively long touch scan period between outputs of two rows of shift register units. Thereby, the defects of insufficient charging rate of the row pixels may be avoided while remaining a high report rate of the touch scan, so as to improve the dark lines or bad bright lines significantly and to improve the display quality.

The skilled person in the art would appreciate that all or part of steps for implementing the above method according to the embodiment of the present invention may be achieved by hardware associated with program instructions. The above program may be stored in a computer readable store medium and may perform the above steps in the above method according to the embodiment of the present invention when the program is executed. The above store medium includes all of media which may store program codes, such as ROM, RAM, magnetic discs or optical discs.

The above embodiments are only used to explain the present disclosure, instead of limiting the present invention. It would be appreciated by those skilled in the art that various changes or modifications may be made apparently in these embodiments within the technical scope of the present disclosure. Thus, the scope of the present invention is defined in the claims.

What is claimed is:

1. A shift register unit, comprising:
an input reset module which has a first signal input end, a second signal input end, a first voltage connecting end, a second voltage connecting end and a first pull up control node connecting end, and is configured to control a level at the pull up control node depending on a signal inputted from the first signal input end and the second signal input end;
a pull up module which has a first clock signal input end, a second pull up control node connecting end and a pull up module signal output end and is configured to selectively pull up the signal outputted from the pull up module signal output end to a high level depending on the level at the pull up control node and the clock signal inputted from the first clock signal input end;
a control module which has a second clock signal input end, a first connecting end for a third voltage, a third pull up control node connecting end and a first pull down control node connecting end and is configured to control a level at the pull down control node depending on the clock signal inputted from the second clock signal input end and the level at the pull up control node; and
a pull down module which has a fourth pull up control node connecting end, a second pull down control node connecting end, a second connecting end for the third voltage, a fourth voltage connecting end and a pull down module signal output end and is configured to selectively pull down the signal outputted from the pull down module signal output end to a low level,
wherein the first voltage connecting end is connected to a first voltage input end of the shift register unit, the second voltage connecting end is connected to a second voltage input end of the shift register unit, the first connecting end for the third voltage and the second connecting end for the third voltage are both connected to the third voltage input end of the shift register unit, the fourth voltage connecting end is connected to a fourth voltage input end of the shift register unit, the pull up module signal output end and the pull down module signal output end are connected to form a signal output end of the shift register unit, the pull up control node being a connecting point connected with the first pull up control node connecting end, the second pull up control node connecting end, the third pull up control node connecting end and the fourth pull up control node connecting end, the pull down control node being a connecting point connected with the first pull down control node connecting end and the second pull down control node connecting end, wherein the high level is inputted into the second signal input end in a touch scan to maintain the level at the pull up control node.

2. The shift register unit according to claim 1, wherein the input reset module comprises:
a first transistor which has a first electrode connected to the first pull up control node connecting end, a gate electrode connected to the first signal input end and a second electrode connected to the first voltage connecting end, the first electrode of the first transistor being one of a source electrode and a drain electrode of the first transistor, the second electrode of the first transistor being the other of the source electrode and the drain electrode of the first transistor; and
a second transistor which has a first electrode connected to the second voltage connecting end, a gate electrode connected to the second signal input end and a second electrode connected to the first pull up control node connecting end, the first electrode of the second transistor being one of a source electrode and a drain electrode of the second transistor, the second electrode of the second transistor being the other of the source electrode and the drain electrode of the second transistor.

3. The shift register unit according to claim 2, wherein the signal inputted from the first voltage connecting end is a signal inputted from the first signal input end.

4. The shift register unit according to claim 1, wherein the pull up module comprises:
a third transistor which has a first electrode connected to the pull up module signal output end, a gate electrode connected to the second pull up control node connecting end and a second electrode connected to the first clock signal input end, the first electrode of the third transistor being one of a source electrode and a drain electrode of the third transistor, the second electrode of the third transistor being the other of the source electrode and the drain electrode of the third transistor; and
a capacitance connected between the gate electrode of the third transistor and the first electrode of the third transistor.

5. The shift register unit according to claim 1, wherein the control module comprises:
a fourth transistor which has a gate electrode and a second electrode both connected to the second clock signal input end;
a fifth transistor which has a gate electrode connected to a first electrode of the fourth transistor and a second electrode connected to the second clock signal input end;
a sixth transistor which has a first electrode connected to the first connecting end for the third voltage, a gate electrode connected to the third pull up control node connecting end and a second electrode connected to the first electrode of the fourth transistor;
a seventh transistor which has a first electrode connected to the first connecting end for the third voltage, a gate electrode connected to the third pull up control node connecting end and a second electrode connected to the first pull down control node connecting end,
wherein the first electrode of any one transistor of the fourth to seventh transistors being one of a source electrode and a drain electrode of the one transistor, the second electrode of any one transistor of the fourth to seventh transistors being the other of the source electrode and the drain electrode of the one transistor.

6. The shift register unit according to claim 3, wherein the pull down module comprises:
an eighth transistor which has a first electrode connected to the fourth voltage connecting end, a gate electrode connected to the second pull down control node connecting end and a second electrode connected to the fourth pull up control node connecting end, wherein an input voltage at the fourth voltage connecting end is the same as that at the second voltage connecting end;
a ninth transistor which has a first electrode connected to the second connecting end for the third voltage, a gate electrode connected to the second pull down control node connecting end and a second electrode connected to the pull down module signal output end,
wherein the first electrode of any one transistor of the eighth to ninth transistors being one of a source electrode and a drain electrode of the one transistor, the second electrode of any one transistor of the eighth to ninth transistors being the other of the source electrode and the drain electrode of the one transistor.

7. The shift register unit according to claim 1, wherein the pull down module comprises:
an eighth transistor which has a first electrode connected to the fourth voltage connecting end, a gate electrode connected to the second pull down control node connecting end and a second electrode connected to the fourth pull up control node connecting end; and
a ninth transistor which has a first electrode connected to the second connecting end for the third voltage, a gate electrode connected to the second pull down control node connecting end and a second electrode connected to the pull down module signal output end.

8. A gate electrode drive circuit, comprising a plurality of shift register units cascaded to each other, wherein touch scan and scan output for the plurality of cascaded shift register units are performed alternatively, the shift register unit comprising: an input reset module which has a first signal input end, a second signal input end, a first voltage connecting end, a second voltage connecting end and a first pull up control node connecting end, and is configured to control a level at the pull up control node depending on a signal inputted from the first signal input end and the second signal input end; a pull up module which has a first clock signal input end, a second pull up control node connecting end and a pull up module signal output end and is configured to selectively pull up the signal outputted from the pull up module signal output end to a high level depending on the level at the pull up control node and the clock signal inputted from the first clock signal input end; a control module which has a second clock signal input end, a first connecting end for a third voltage, a third pull up control node connecting end and a first pull down control node connecting end and is configured to control a level at the pull down control node depending on the clock signal inputted from the second clock signal input end and the level at the pull up control node; and a pull down module which has a fourth pull up control node connecting end, a second pull down control node connecting end, a second connecting end for the third voltage, a fourth voltage connecting end and a pull down module signal output end and is configured to selectively pull down the signal outputted from the pull down module signal output end to a low level, wherein the first voltage connecting end is connected to a first voltage input end of the shift register unit, the second voltage connecting end is connected to a second voltage input end of the shift register unit, the first connecting end for the third voltage and the second connecting end for the third voltage are both connected to the third voltage input end of the shift register unit, the fourth voltage connecting end is connected to a fourth voltage input end of the shift register unit, the pull up module signal output end and the pull down module signal output end are connected to form a signal output end of the shift register unit, the pull up control node being a connecting point connected with the first pull up control node connecting end, the second pull up control node connecting end, the third pull up control node connecting end and the fourth pull up control node connecting end, the pull down control node being a connecting point connected with the first pull down control node connecting end and the second pull down control node connecting end, wherein the high level is inputted into the second signal input end in a touch scan to maintain the level at the pull up control node;

other than the first cascade shift register unit, the signal output end of each shift register unit is connected to the second signal input end of the adjacent previous cascade shift register unit; and other than the last cascade shift register unit, the signal output end of each shift register unit is connected to the first signal input end of the adjacent next cascade shift register unit.

9. The gate electrode drive circuit according to claim 8, wherein a frame initialization signal is inputted into the first signal input end of the first cascade shift register unit and a reset signal is inputted into the second signal input end of the last cascade shift register unit, or a frame initialization signal is inputted into the second signal input end of the last cascade shift register unit and a reset signal is inputted into the first signal input end of the first cascade shift register unit.

10. A display apparatus, comprising a gate electrode drive circuit, the gate electrode drive circuit comprising a plurality of shift register units cascaded to each other, wherein touch scan and scan output for the plurality of cascaded shift register units are performed alternatively, the shift register unit comprising: an input reset module which has a first signal input end, a second signal input end, a first voltage connecting end, a second voltage connecting end and a first pull up control node connecting end, and is configured to control a level at the pull up control node depending on a signal inputted from the first signal input end and the second signal input end; a pull up module which has a first clock signal input end, a second pull up control node connecting end and a pull up module signal output end and is configured to selectively pull up the signal outputted from the pull up module signal output end to a high level depending on the level at the pull up control node and the clock signal inputted from the first clock signal input end; a control module which has a second clock signal input end, a first connecting end for a third voltage, a third pull up control node connecting end and a first pull down control node connecting end and is configured to control a level at the pull down control node depending on the clock signal inputted from the second clock signal input end and the level at the pull up control node; and a pull down module which has a fourth pull up control node connecting end, a second pull down control node connecting end, a second connecting end for the third voltage, a fourth voltage connecting end and a pull down module signal output end and is configured to selectively pull down the signal outputted from the pull down module signal output end to a low level, wherein the first voltage connecting end is connected to a first voltage input end of the shift register unit, the second voltage connecting end is connected to a second voltage input end of the shift register unit, the first connecting end for the third voltage and the second connecting end for the third voltage are both connected to the third voltage input end of the shift register unit, the fourth voltage connecting end is connected to a fourth voltage input end of the shift register unit, the pull up module signal output end and the pull down module signal output end are connected to form a signal output end of the shift register unit, the pull up control node being a connecting point connected with the first pull up control node connecting end, the second pull up control node connecting end, the third pull up control node connecting end and the fourth pull up control node connecting end, the pull down control node being a connecting point connected with the first pull down control node connecting end and the second pull down control node connecting end, wherein the high level is inputted into the second signal input end in a touch scan to maintain the level at the pull up control node;

other than the first cascade shift register unit, the signal output end of each shift register unit is connected to the second signal input end of the adjacent previous cascade shift register unit; and other than the last cascade shift register unit, the signal output end of each shift register unit is connected to the first signal input end of the adjacent next cascade shift register unit.

11. The gate electrode drive circuit according to claim 8, wherein the input reset module comprises:

a first transistor which has a first electrode connected to the first pull up control node connecting end, a gate electrode connected to the first signal input end and a second electrode connected to the first voltage connecting end, the first electrode of the first transistor being one of a source electrode and a drain electrode of the first transistor, the second electrode of the first transistor being the other of the source electrode and the drain electrode of the first transistor; and a second transistor which has a first electrode connected to the second voltage connecting end, a gate electrode connected to the second signal input end and a second electrode connected to the first pull up control node connecting end, the first electrode of the second transistor being one of a source electrode and a drain electrode of the second transistor, the second electrode of the second transistor being the other of the source electrode and the drain electrode of the second transistor.

12. The gate electrode drive circuit according to claim 11, wherein the signal inputted from the first voltage connecting end is a signal inputted from the first signal input end.

13. The gate electrode drive circuit according to claim 8, wherein the pull up module comprises:

a third transistor which has a first electrode connected to the pull up module signal output end, a gate electrode connected to the second pull up control node connecting end and a second electrode connected to the first clock signal input end, the first electrode of the third transistor being one of a source electrode and a drain electrode of the third transistor, the second electrode of the third transistor being the other of the source electrode and the drain electrode of the third transistor; and a capacitance connected between the gate electrode of the third transistor and the first electrode of the third transistor.

14. The gate electrode drive circuit according to claim 8, wherein the control module comprises:

a fourth transistor which has a gate electrode and a second electrode both connected to the second clock signal input end;

a fifth transistor which has a gate electrode connected to a first electrode of the fourth transistor and a second electrode connected to the second clock signal input end;

a sixth transistor which has a first electrode connected to the first connecting end for the third voltage, a gate electrode connected to the third pull up control node connecting end and a second electrode connected to the first electrode of the fourth transistor;

a seventh transistor which has a first electrode connected to the first connecting end for the third voltage, a gate electrode connected to the third pull up control node connecting end and a second electrode connected to the first pull down control node connecting end, wherein the first electrode of any one transistor of the fourth to seventh transistors being one of a source electrode and a drain electrode of the one transistor, the second electrode of any one transistor of the fourth to seventh transistors being the other of the source electrode and the drain electrode of the one transistor.

15. The gate electrode drive circuit according to claim 10, wherein the pull down module comprises:

an eighth transistor which has a first electrode connected to the fourth voltage connecting end, a gate electrode connected to the second pull down control node connecting end and a second electrode connected to the fourth pull up control node connecting end, wherein an input voltage at the fourth voltage connecting end is the same as that at the second voltage connecting end;

a ninth transistor which has a first electrode connected to the second connecting end for the third voltage, a gate electrode connected to the second pull down control node connecting end and a second electrode connected to the pull down module signal output end, wherein the first electrode of any one transistor of the eighth to ninth transistors being one of a source electrode and a drain electrode of the one transistor, the second electrode of any one transistor of the eighth to ninth transistors being the other of the source electrode and the drain electrode of the one transistor.

16. The gate electrode drive circuit according to claim 8, wherein the pull down module comprises:

an eighth transistor which has a first electrode connected to the fourth voltage connecting end, a gate electrode connected to the second pull down control node connecting end and a second electrode connected to the fourth pull up control node connecting end; and a ninth transistor which has a first electrode connected to the second connecting end for the third voltage, a gate electrode connected to the second pull down control node connecting end and a second electrode connected to the pull down module signal output end.

17. The display apparatus according to claim 10, wherein the input reset module comprises:

a first transistor which has a first electrode connected to the first pull up control node connecting end, a gate electrode connected to the first signal input end and a second electrode connected to the first voltage connecting end, the first electrode of the first transistor being one of a source electrode and a drain electrode of the first transistor, the second electrode of the first transistor being the other of the source electrode and the drain electrode of the first transistor; and a second transistor which has a first electrode connected to the second voltage connecting end, a gate electrode connected to the second signal input end and a second electrode connected to the first pull up control node connecting end, the first electrode of the second transistor being one of a source electrode and a drain electrode of the second transistor, the second electrode of the second transistor being the other of the source electrode and the drain electrode of the second transistor.

18. The display apparatus according to claim 17, wherein the signal inputted from the first voltage connecting end is a signal inputted from the first signal input end.

19. The display apparatus according to claim 10, wherein the pull up module comprises:

a third transistor which has a first electrode connected to the pull up module signal output end, a gate electrode connected to the second pull up control node connecting end and a second electrode connected to the first clock signal input end, the first electrode of the third transistor being one of a source electrode and a drain electrode of the third transistor, the second electrode of the third transistor being the other of the source electrode and the drain electrode of the third transistor; and a capacitance connected between the gate electrode of the third transistor and the first electrode of the third transistor.

20. The display apparatus according to claim 10, wherein a frame initialization signal is inputted into the first signal input end of the first cascade shift register unit and a reset signal is inputted into the second signal input end of the last cascade shift register unit, or a frame initialization signal is inputted into the second signal input end of the last cascade shift register unit and a reset signal is inputted into the first signal input end of the first cascade shift register unit.

* * * * *